United States Patent [19]
Kim

[11] Patent Number: 5,956,599
[45] Date of Patent: Sep. 21, 1999

[54] METHOD FOR FORMING ISOLATION LAYER IN SEMICONDUCTOR DEVICE

[75] Inventor: Yong Chan Kim, Chungcheongbuk-do, Rep. of Korea

[73] Assignee: LG Semicon Co., Ltd., Cheongju-Si, Rep. of Korea

[21] Appl. No.: 08/893,583

[22] Filed: Jul. 11, 1997

[30]      Foreign Application Priority Data

Oct. 24, 1996 [KR]   Rep. of Korea ..................... 96-48000

[51] Int. Cl.⁶ .................................................. H01L 21/76
[52] U.S. Cl. ............................................................ 438/444
[58] Field of Search .......................... 438/444, FOR 232; 148/DIG. 85, DIG. 86

[56]             References Cited
          U.S. PATENT DOCUMENTS 3,961,999   6/1976  Antipov .
4,278,705   7/1981  Agraz-Guerena .
5,234,845   8/1993  Aoki et al. .

FOREIGN PATENT DOCUMENTS 410135320   5/1998  Japan .

*Primary Examiner*—George Fourson

[57]          ABSTRACT

The method for forming a semiconductor device isolation layer, which advantageously simplifies the manufacture and planarization of the device, includes the steps of forming a V-shaped groove of a predetermined width and depth in a device isolation region of a semiconductor substrate and subjecting the substrate to a thermal oxidation process to form the device isolation layer.

14 Claims, 8 Drawing Sheets

METHOD FOR FORMING ISOLATION LAYER IN SEMICONDUCTOR DEVICE

BACKGROUND OF THE INVENTION

1. Field of the Invention

The present invention relates to a semiconductor device and, more particularly, to a method for forming a semiconductor device isolation layer.

2. Discussion of the Related Art

When manufacturing a semiconductor device, a semiconductor device isolation layer is formed to isolate one cell from another on the substrate. The methods for forming a device isolation layer in a bipolar device include a junction isolation method, an oxide film isolation method, a trench isolation method, and an isolation method in which an epitaxial layer is grown selectively.

With reference to the accompanying drawings, conventional methods for forming a device isolation layer will be explained.

FIGS. 1a through 1d are cross-sectional views each showing a structure of a conventional isolation layer of a semiconductor device. FIGS. 2a through 2f are sectional views showing the process steps of a conventional method for fabricating an isolation layer of a semiconductor device.

FIG. 1a shows a section of a bipolar transistor having a trench type isolation layer. As shown in FIG. 1a, the semiconductor device includes a buried layer 2 formed selectively in a portion of the surface of a semiconductor substrate 1, a channel stop layer 3 formed selectively in another portion of the surface of the semiconductor substrate 1 where the buried layer 2 is not formed, an epitaxial layer 4 formed over the semiconductor substrate 1 exclusive of the channel stop layer 3, CVD (chemical vapor deposition) film 5 formed selectively on the channel stop layer 3 where the epitaxial layer is not formed, a field oxide film 7 formed on the CVD film 5 wider than the CVD film 5, base electrode layers 6 formed in the epitaxial layer 4 where the field oxide film 7 is not formed, an emitter electrode layer 8 formed in each base electrode layer 6, an insulating layer 9 formed over the entire surface of the substrate 1, inclusive of the base electrode layer 6 and the emitter electrode layers 8 and exclusive of the field oxide film 7, contact holes 20 formed in the insulating layer 9, and metal layers 10 in contact with the base electrode layers 6 and the emitter electrode layers 8 through the contact holes 20.

FIG. 1b shows a bipolar transistor having an ROI (recessed oxide isolation) type device isolation layer. As shown in FIG. 1b, the semiconductor device includes a buried layer 2 formed selectively in a portion of the surface of the semiconductor substrate 1, a channel stop layer 3 formed selectively in another portion of the surface of the semiconductor substrate 1 in which the buried layer 2 is not formed, an epitaxial layer 4 formed over the semiconductor layer 1 exclusive of the channel stop layer 3, a field oxide film 7 formed on the channel stop layer 3 wider than the channel stop layer 3, base electrode layers 6 isolated by the field oxide film 7 and formed in the epitaxial layer 4, emitter electrode layers 8 each formed in one of the base electrode layers 6, an insulating layer 9 formed over the entire semiconductor substrate 1 inclusive of the base electrode layers 6 and the emitter electrode layers 8 and exclusive of the field oxide film 7, contact holes 20 to the base electrode layers 6 and the emitter electrode layers 8 formed in the insulating layer 9, and metal layers 10 in contact with the base electrode layers 6 and the emitter electrode layers 8 through the contact holes 20. In the process of forming an ROI type device isolation layer, half of the thickness of the epitaxial layer 4 is etched and the field oxide film 7 is formed using the well-known LOCOS (Local Oxidation of Silicon) process. Preferably, the field oxide film 7 should be thicker than the epitaxial layer 4 to obtain isolation.

FIG. 1c shows a device isolation layer developed from the ROI type device isolation layer wherein the field oxide film is planarized by etch back.

FIG. 1d shows a device isolation layer of a SWAMI (side wall masked isolation) type formed like the device isolation layer shown in FIG. 1c, and wherein the field oxide film is planarized by etch back.

A conventional method for forming a device isolation layer having a structure as discussed above will be explained with reference to FIGS. 2a through 2f. Specifically, FIGS. 2a through 2f illustrate a conventional method for forming a device isolation layer of a trench type shown in FIG. 1a.

Referring to FIG. 2a, a buried layer 2 is formed selectively in a surface of a semiconductor substrate 1. Then, a channel stop layer 3 is formed selectively with an ion implantation process in another portion of the surface of the semiconductor substrate 1 where the buried layer 2 is not formed, and an epitaxial layer 4 having a specific thickness is formed over the entire surface of the semiconductor substrate 1. A buffer oxide layer 11 and a nitride film 12 are formed successively on the epitaxial layer 4.

Referring to FIG. 2b, the nitride film 12, the buffer oxide layer 11, and the epitaxial layer 4 over the channel stop layer 3 are etched selectively to form a trench 13.

Referring to FIG. 2c, the nitride film 12 and the buffer oxide layer 11 are removed selectively, and a thin oxide film 14 is formed over the entire surface of the substrate 1 including the trench region 13 in order to reduce the leakage current on the etched surface. A CVD film 5 is formed on the entire surface of the thin oxide film 14, and etched back to leave the CVD film 5 only in the trench region 13.

Referring to FIG. 2d, a buffer oxide film 12a and a nitride film 13a are formed successively on the entire surface of the substrate 1, and a portion of the nitride film 13a is removed selectively.

Referring to FIG. 2e, with the patterned nitride film 13a used as a mask, a field oxide film 7 is formed using a field oxidation process.

Referring to FIG. 2f, after removing the nitride film 13a and the buffer oxide film 12a, base electrode layers 6 and emitter electrode layers 8 are formed in the epitaxial layer 4 where the field oxide film 7 is not formed. An insulating layer 9 is formed over the entire surface of the substrate 1 inclusive of the field oxide film 7. The insulating film 9 is then removed selectively to form contact holes 20 through which a metal line (not shown) will be in contact with the base electrode layers 6 and the emitter electrode layers 8. The field oxide film 7 is formed to a thickness of 1000 Å, i.e., to an extent that the field oxide film 7 can block ions when ions are implanted for forming the base and emitter electrode layers 6 and 8.

The decrease in break-down voltage between terminals in the conventional device having the device isolation layer as described above results from reduced pattern dimensions and high density device packing which affect the product yield and performance of the device. Particularly, the excessive diffusion of the buried layer due to the heat treatment process in the fabrication process greatly affects the break-down voltage of the device. Specially, excessive diffusion, caused by heat treatment of the buried layer, has a great influence on the characteristic of the breakdown voltage. A minute leakage current flowing through junctions or a surface of the substrate is an important factor that affects the device performance.

In order to solve the problems of the breakdown voltage decrease and leakage current between cells, which decreases the performance of a device, device isolation layers with good isolation characteristics are required. Besides, the process for forming device isolation layers has to be simple to the extent that it should not affect the performance of the device.

However, conventional isolation layers for a semiconductor device have the following problems:

First, in the case of the trench type device isolation layer shown in FIGS. 2a–2f, the etch back of the CVD film and the repetitive processes of forming the buffer oxide layer and the nitride layer to form the field oxide film complicates the overall process.

The planarized device isolation layers shown in FIGS. 1b–1d have problems in that the lengthy heat treatment for forming the field oxide film thicker than the thickness of the epitaxial layer to improve isolation causes excessive diffusion of the buried layer and bird's beak to occur. This results in an increase in leakage current that degrades device performance.

A HIPOX(high-pressure oxidation) type device isolation layer proposed to solve the aforementioned problems has high costs with respect to the formation of the isolation layer due to the additional equipment required.

SUMMERY OF THE INVENTION

Accordingly, the present invention is directed to a method for forming a semiconductor device isolation layer which advantageously simplifies the manufacturing process and the planarization of the device, and substantially obviates one or more of problems due to limitations and disadvantages of the related art.

To achieve these and other advantages and in accordance with the purpose of the present invention, as embodied and broadly described, the method form forming a semiconductor device isolation layer includes the steps of forming a V-shaped groove of a predetermined width and depth in an isolation region of a semiconductor substrate; and thermally oxidizing the semiconductor substrate to form a field oxide film in a first portion of a surface of the semiconductor substrate which includes the V-shaped groove.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A method for forming a semiconductor device isolation layer in accordance with a preferred embodiment of the present invention will be explained in detail. The present invention discloses a method for forming a device isolation layer in which an epitaxial layer is etched in a V form to improve performance and planarization of device isolation.

FIGS. 3a–3f are cross-sections showing process steps of a method for forming a semiconductor device isolation layer according to the present invention.

Figure 1A:
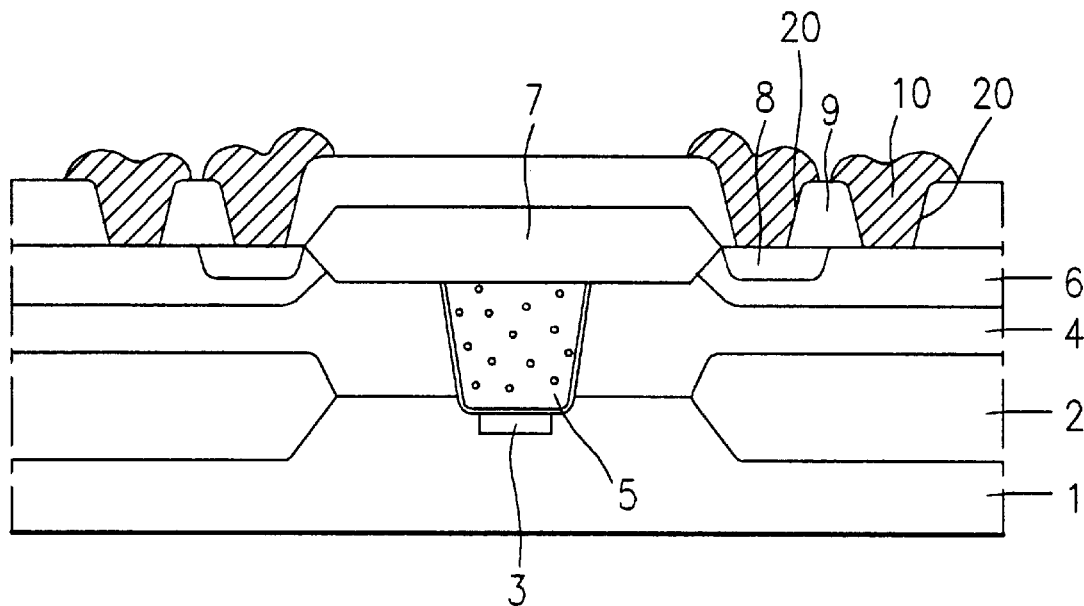
FIGS. 1a–1d are cross sections each showing a structure of a conventional semiconductor device isolation layer.
Figure 1B:
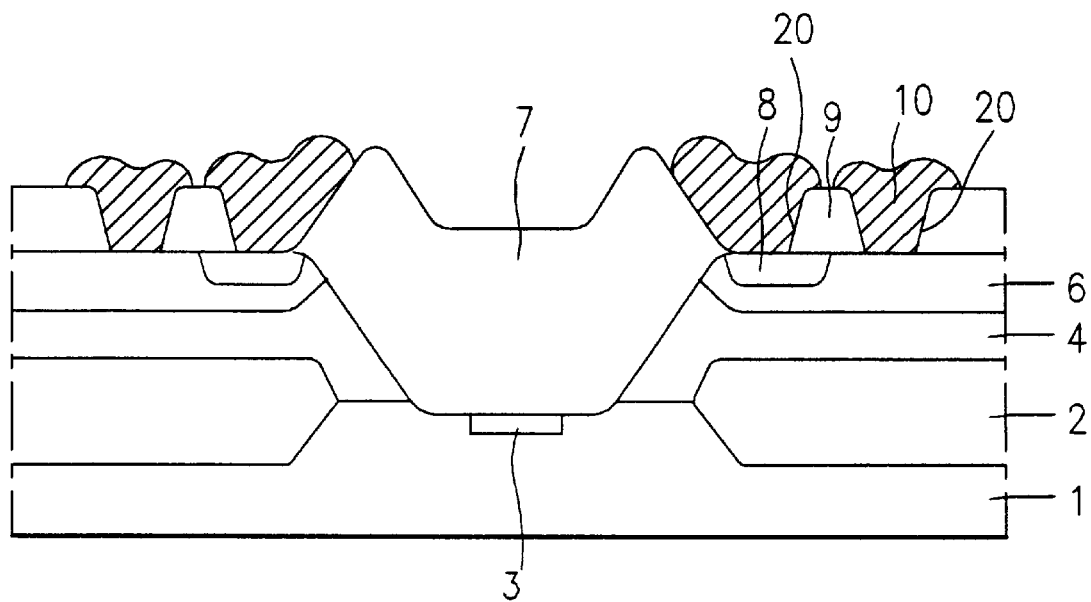
Figure 1C:
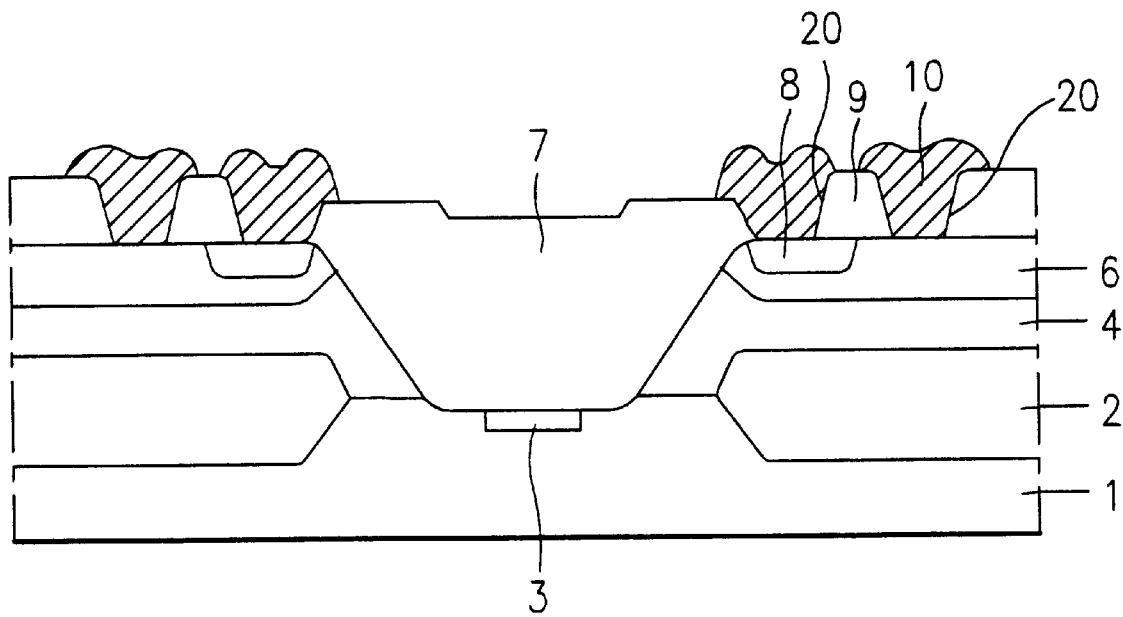
Figure 1D:
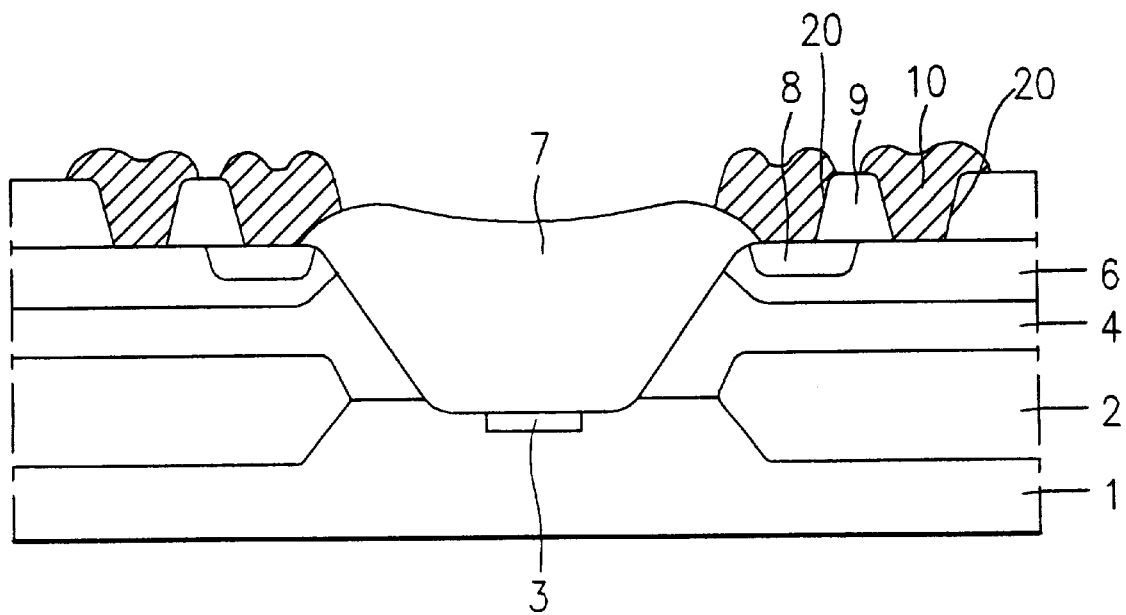
Figure 2A:
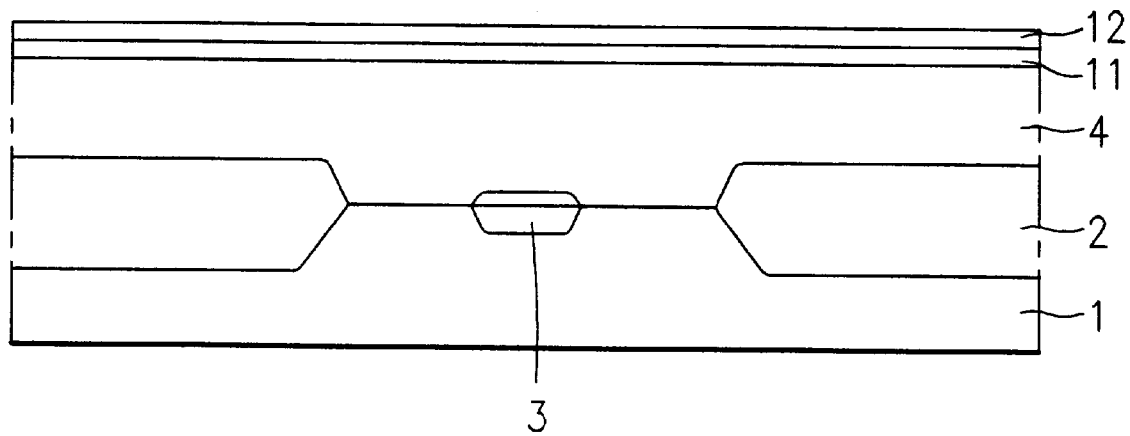
FIGS. 2a–2f illustrate sections showing process steps of a conventional method for forming a device isolation layer; and, FIGS. 3a–3f illustrate sections showing process steps of a method for forming a device isolation layer in accordance with a preferred embodiment of the present invention.
Figure 2B:
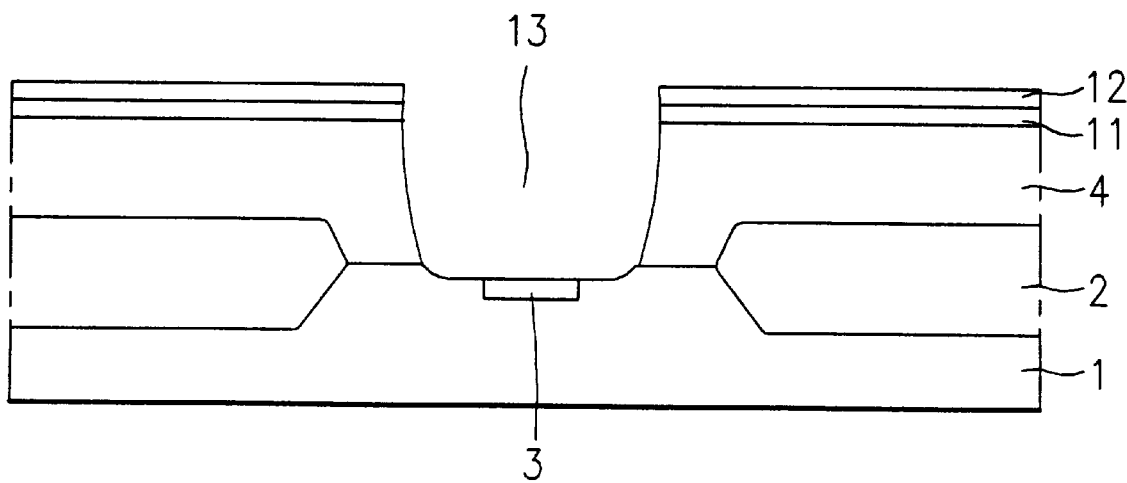
Figure 2C:
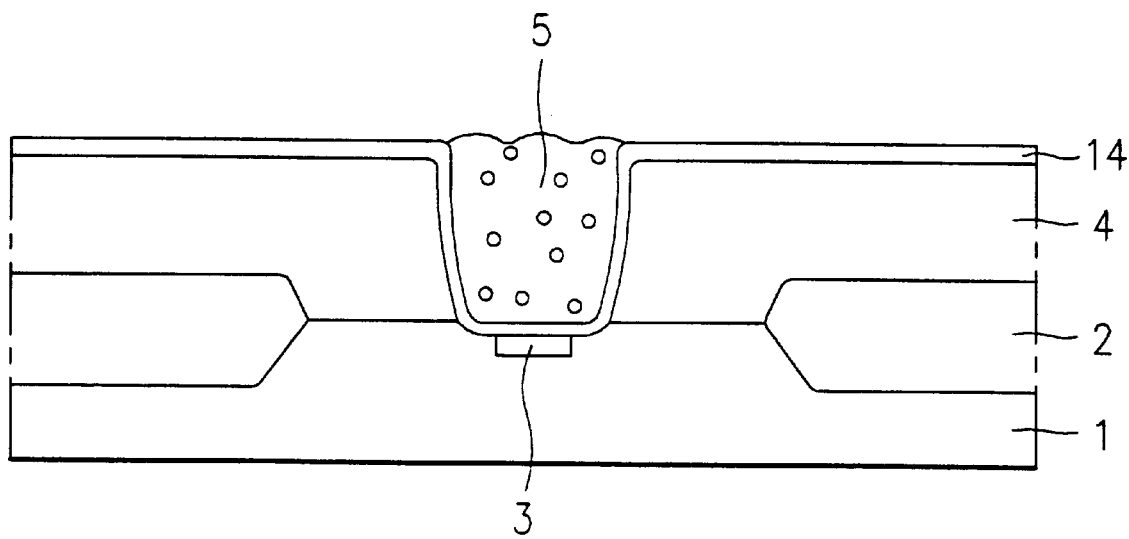
Figure 2D:
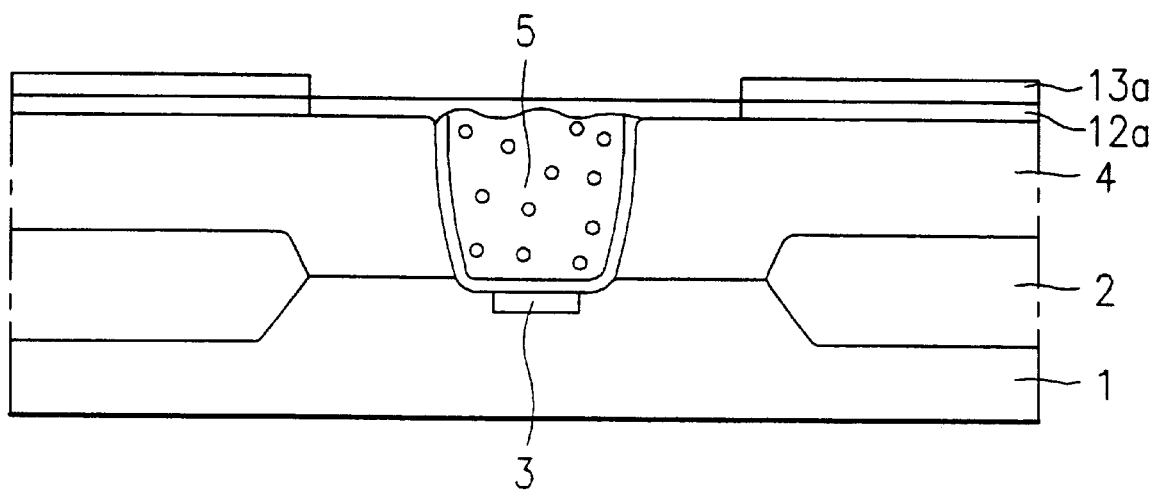
Figure 2E:
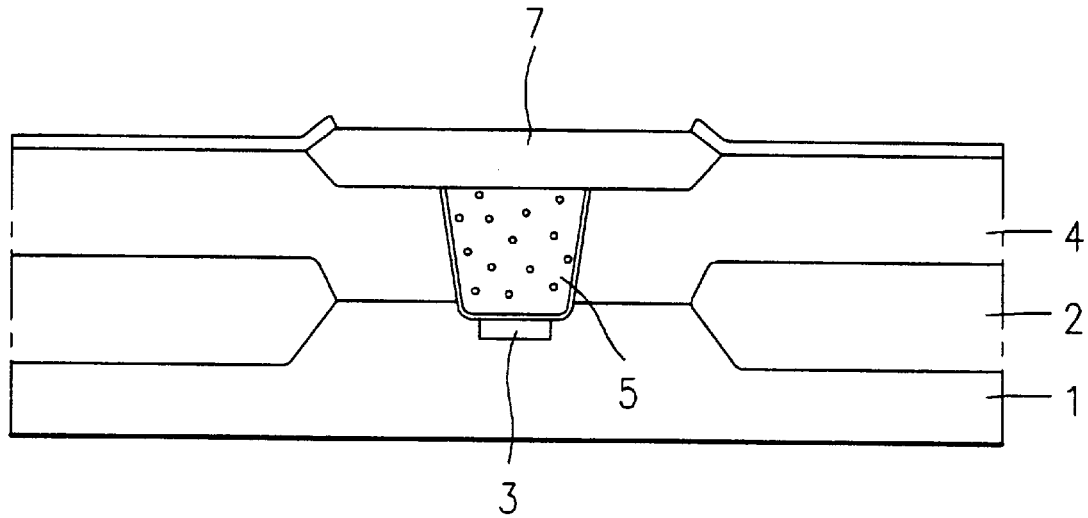
Figure 2F:
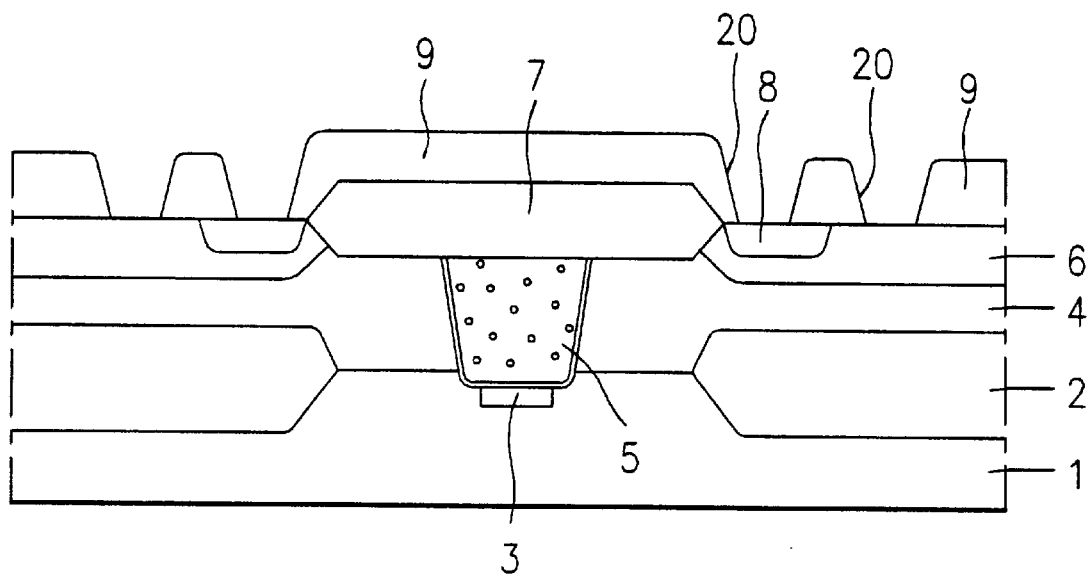
Figure 3A:
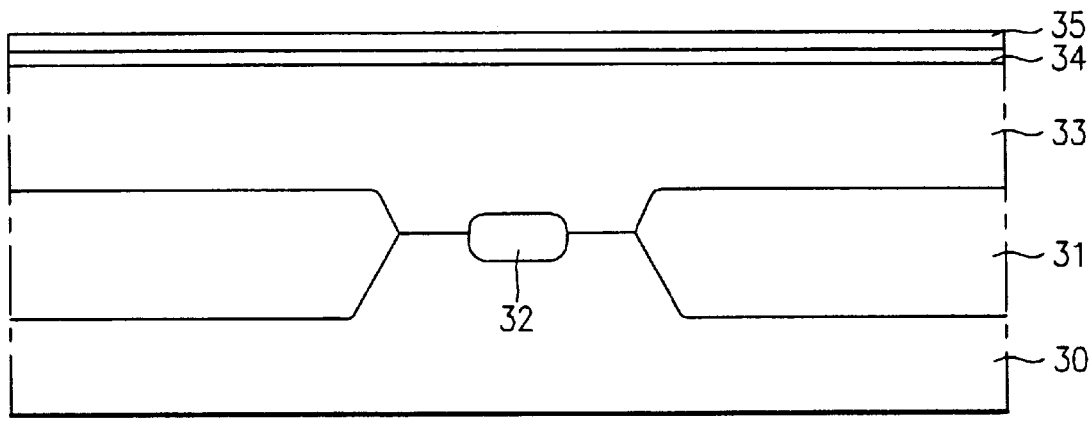

Referring to FIG. 3a, a buried layer 31 is selectively formed in a portion of the surface of a semiconductor substrate 30, and then a channel stop layer 32 is formed by an ion implantation process in another portion of the surface of the semiconductor substrate 30 in which the buried layer 31 is not formed. An epitaxial layer 33, having a predetermined thickness, is formed over the entire surface of the substrate 30. Then, a buffer oxide layer 34 and a nitride layer 35 are successively formed on the epitaxial layer 33.

Figure 3B:
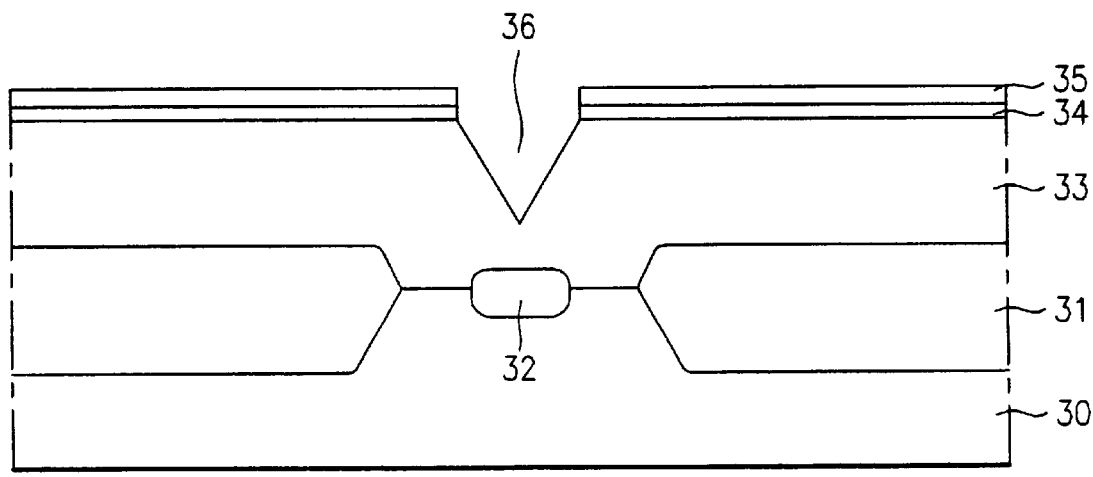

Referring to FIG. 3b, the nitride layer 35 and the buffer oxide layer 34 over the channel stop layer 32 are etched selectively, and the exposed epitaxial layer 33 is etched selectively with a chemical such as KOH to form a V-shaped groove 36 having a consistent opening width (½–⅔ of the thickness of the epitaxial layer 33) to reduce loss of a wafer from excessive etching.

In case a chemical such as KOH is used, the width of the epitaxial layer 33 etched is less than or equal to the width of the opening in the buffer oxide film 34 and the nitride film 35 even when an etching time is exceeded. As a result, excessive etching of the epitaxial layer 33 is prevented. At this time, the lattice orientation of the wafer is (100).

Figure 3C:
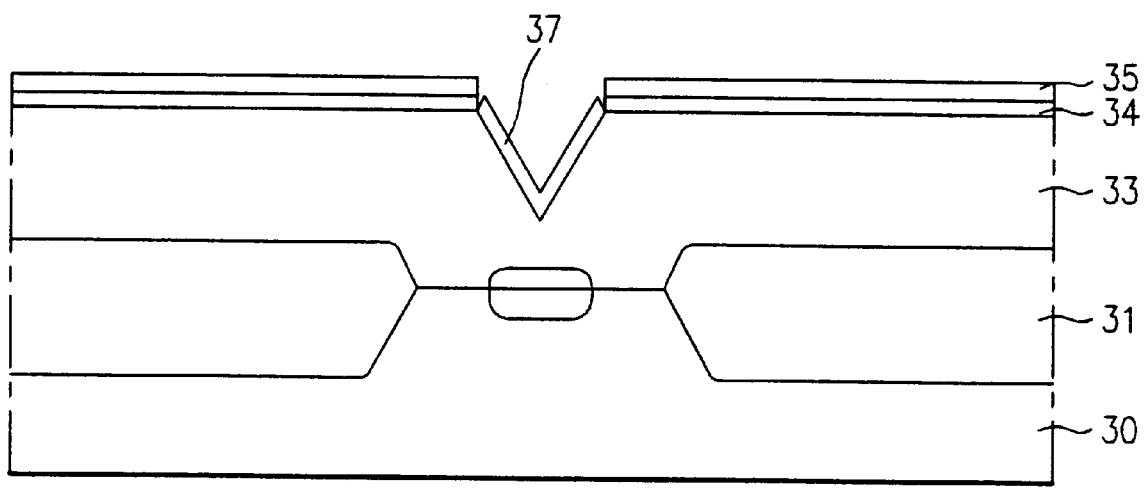

Referring to FIG. 3c, a thin oxide film 37 is formed on the surface of the V-shaped groove 36 to protect the surface of the V-shaped groove during the subsequent process step of etching the nitride layer 35.

Figure 3D:
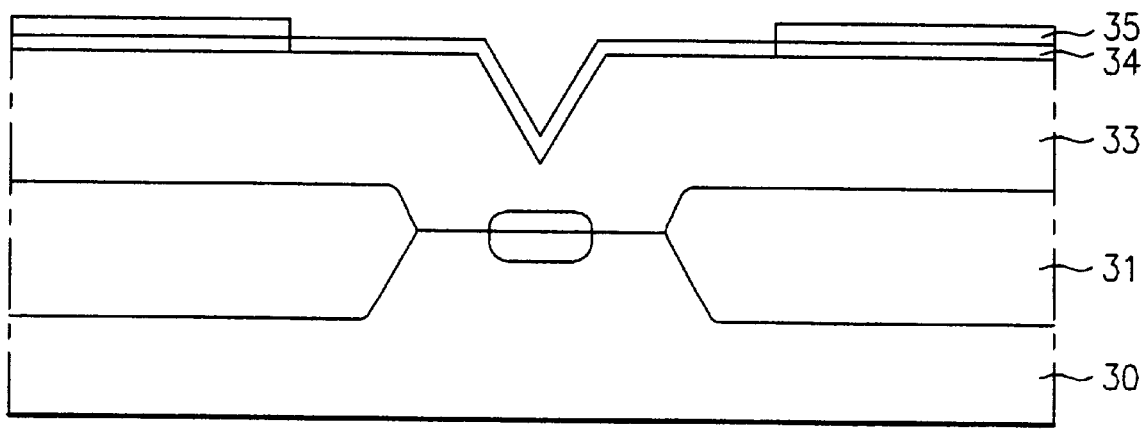

Referring to FIG. 3d, the nitride layer 35 is etched to a predetermined width centered on the V-groove 36 in preparation for forming a field oxide film.

Figure 3E:
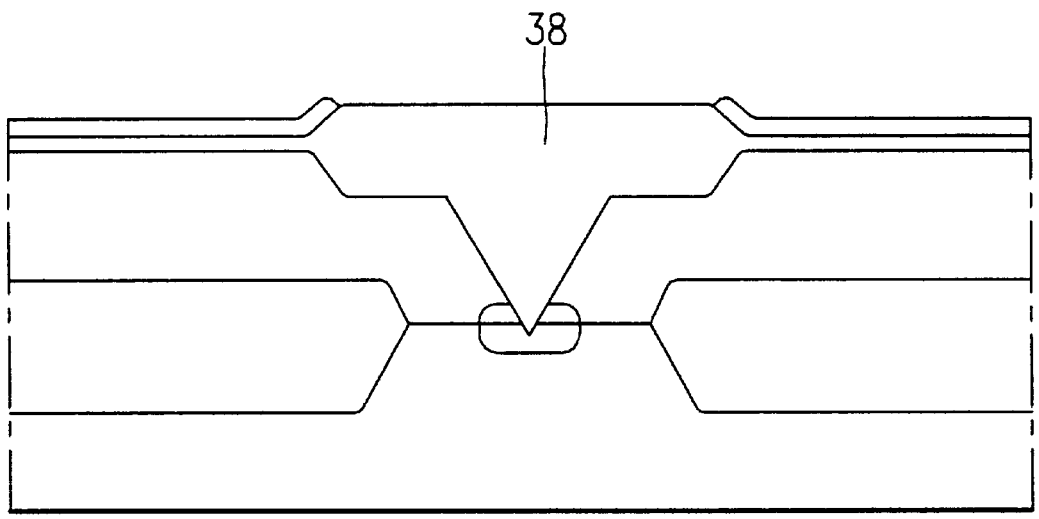

Referring to FIG. 3e, with the patterned nitride layer 35 used as a mask, a LOCOS process is applied to form the field oxide film 38 for isolating devices. In this case, the thickness of the field oxide film 38 formed on top of the epitaxial layer 33, exclusive of the V-shaped groove 36, is formed to be no greater than half that of the epitaxial layer 33. Even though the thickness of the field oxide film 38 is no greater than half that of the epitaxial layer 33, the field oxide film 38 comes into contact with the semiconductor substrate 30. This results in complete device isolation because the thermal oxidation process is performed with the V-shaped groove 36 already formed. For the same reason, adjusting the thickness (thinner compared to the conventional method) of the field oxide film 38 become easy and therefore, the device has excellent planarization even though the etch back process is not conducted after the formation of the field oxide film 38.

Figure 3F:
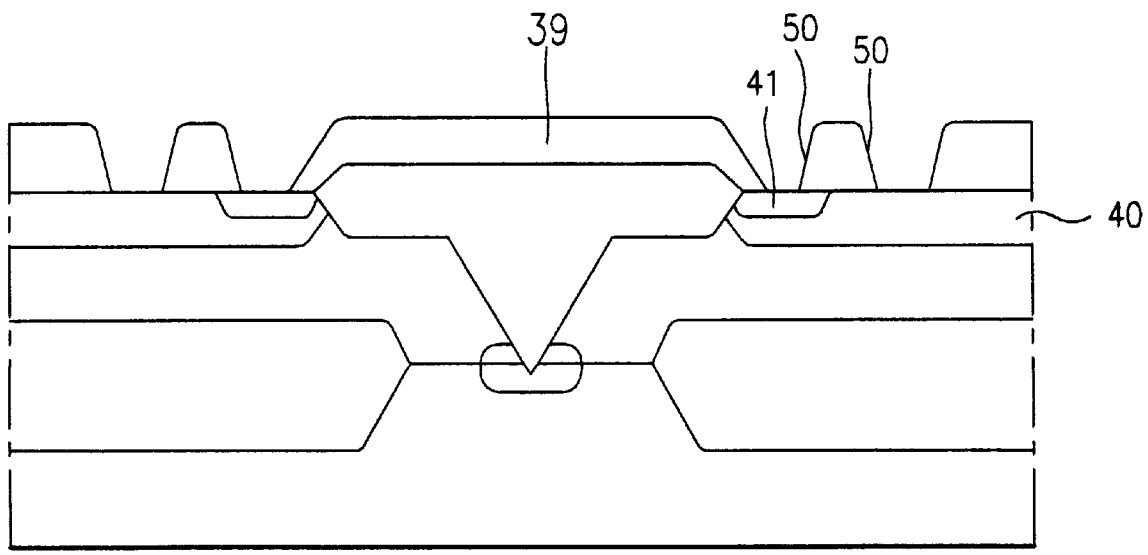

Referring to FIG. 3f, the nitride film 35, which served as a mask during the thermal oxidation process, is removed, and an ion implantation process is carried out on the epitaxial layer 33 where the field oxide film 38 is not formed, so as to form base electrode layers 40 and emitter electrode layers 41. Then, an insulating layer 39 is formed over the entire surface of the substrate 30 inclusive of the field oxide film 38, the base electrode layers 40, and the emitter electrode layers 41. The insulating layer 39 is removed selectively to form contact holes 50 through which metal wiring contacts the base electrode layers 40 and the emitter electrode layers 41.

The method for forming a semiconductor device isolation layer of the present invention, in which a device isolation layer is formed after a V-shaped groove is formed, has the following advantages.

First, despite the thin field oxide film, satisfactory device isolation can be achieved because the thermal oxidation process is carried out after formation of the V-shaped groove. This makes it possible to adjust the extent of the flatness of the field oxide film 38 such that an etch back process is not required to increase flatness of the device after the formation of the field oxide film. Besides, the manufacturing time and cost are reduced because additional process steps such as etch back are omitted. Furthermore, excessive heat treatment is not required since it is possible to adjust the thickness of the field oxide film to achieve a thinner field oxide film, as compared to conventional isolation layers, while achieving device isolation. Accordingly, the method of the present invention has the advantages that excessive diffusion of the buried layer and the occurrence of bird's beak are suppressed and stress on the interface of the semiconductor substrate is reduced, thereby improving the performance of the device.

It will be apparent to those skilled in the art that various modification and variations can be made in the method for forming a semiconductor device isolation layer of the present invention without departing from the spirit or scope of the inventions. Thus, it is intended that the present invention cover the modifications and variations of this invention provided they come within the scope of the appended claims and their equivalents.

What is claimed is:

1. A method for forming an isolation layer of a semiconductor device comprising the steps of:

forming a V-shaped groove of a predetermined width and depth in an isolation region of a semiconductor substrate; and thermally oxidizing the semiconductor substrate to form a field oxide film in a first portion of a surface of the semiconductor substrate which includes the V-shaped groove.

2. The method as claimed in claim 1, wherein said forming step forms the V-shaped groove to have an opening with a width of ½–⅔ a thickness of the semiconductor substrate.

3. The method as claimed in claim 2, wherein said forming step forms the V-shaped groove by etching the semiconductor substrate with a KOH solution.

4. The method as claimed in claim 1, wherein the thermally oxidizing step also forms the field oxide film in a second portion of the surface of the semiconductor substrate not including the V-shaped groove, and a thickness of the field oxide film in the second portion is less than or equal to half a thickness of the semiconductor substrate.

5. The method of claim 1, wherein:

the semiconductor substrate includes a substrate layer, a buried layer formed in a first portion of the substrate layer, and an epitaxial layer formed over the substrate layer and the buried layer.

6. The method as claimed in claim 5, wherein said forming step forms the V-shaped groove to have an opening with a width of ½–⅔ a thickness of the epitaxial layer.

7. The method as claimed in claim 5, wherein:

the forming step forms the V-shaped groove in the epitaxial layer; and the thermally oxidizing step forms the field oxide film in a second portion of the surface of the epitaxial layer not including the V-shaped groove, and a thickness of the field oxide film in the second portion is less than or equal to half a thickness of the epitaxial layer.

8. A method for forming a semiconductor device isolation layer comprising the steps of:

selectively forming a buried layer in a surface of a substrate layer;

selectively forming a channel stop layer in a portion of a surface of the substrate layer where the buried layer is not formed;

forming an epitaxial layer over the substrate layer including the buried layer and the channel stop layer;

selectively etching a portion of the epitaxial layer over the channel stop layer to form a V-shaped groove therein; and forming a field oxide film having a width wider than a width of the V-shaped groove in the epitaxial layer centered on the V-shaped groove.

9. The method as claimed in claim 5, wherein the step for selectively etching the epitaxial layer includes the steps of:

successively forming a buffer oxide film and a nitride film on the epitaxial layer;

first etching the buffer oxide film and the nitride film over the channel stop layer; and, second etching the epitaxial layer exposed by the first etching step using the buffer oxide layer and the nitride layer as masks to form the V-shaped groove.

10. The method as claimed in claim 9, wherein the buffer oxide film and the nitride film are removed to form an opening having a width ½–⅔ of a thickness of the epitaxial layer.

11. The method as claimed in claim 10, wherein the second etching step uses KOH as an etchant.

12. The method as claimed in claim 8, wherein a lattice orientation of the substrate layer is (100).

13. The method as claimed in claim 8, wherein the forming a field oxide film step forms the field oxide film in a second portion of the surface of the epitaxial layer not including the V-shaped groove, and a thickness of the field oxide film in the second portion is less than or equal to half a thickness of the epitaxial layer.

14. The method as claimed in claim 8, further comprising, prior to the forming a field oxide film step, the step of:

forming a thin oxide layer on a surface of the V-shaped groove.

* * * * *